(12) United States Patent
Mitchell et al.

(10) Patent No.: US 9,129,742 B2
(45) Date of Patent: Sep. 8, 2015

(54) GAS TURBINE ENGINE COMPRISING AN ULTRA HIGH TEMPERATURE CIRCUIT COUPLING OPEN CORE TRANSFORMER

(75) Inventors: David J. Mitchell, Oviedo, FL (US); Cora Schillig, Orlando, FL (US); Rod Waits, Sunnyvale, CA (US); Anand A. Kulkarni, Oviedo, FL (US)

(73) Assignee: Siemens Energy, Inc., Orlando, FL (US)

( * ) Notice: Subject to any disclaimer, the term of this patent is extended or adjusted under 35 U.S.C. 154(b) by 885 days.

(21) Appl. No.: 13/176,800

(22) Filed: Jul. 6, 2011

(65) Prior Publication Data
US 2013/0008179 A1    Jan. 10, 2013

(51) Int. Cl.
G08C 17/04    (2006.01)
G01R 15/18    (2006.01)
H01F 38/14    (2006.01)

(52) U.S. Cl.
CPC ............. *H01F 38/14* (2013.01); *G01R 15/18* (2013.01); *G08C 17/04* (2013.01); *G01R 15/183* (2013.01); *G01R 15/186* (2013.01)

(58) Field of Classification Search
CPC .... G01R 15/18; G01R 15/183; G01R 15/186; G08C 17/04
USPC .......... 60/39.091; 340/870.1, 870.07, 870.31, 340/529.3, 870.17; 374/179, 141; 73/754; 702/117, 130; 324/166, 127
See application file for complete search history.

(56) References Cited

U.S. PATENT DOCUMENTS

| | | |
|---|---|---|
| 4,611,464 A | 9/1986 | Hetzer et al. |
| 4,709,155 A | 11/1987 | Yamaguchi et al. |
| 4,729,102 A | 3/1988 | Miller et al. |
| 4,729,424 A | 3/1988 | Mizuno et al. |
| 5,134,843 A | 8/1992 | Wakeman |
| 5,185,700 A | 2/1993 | Bezos et al. |
| 5,363,095 A | 11/1994 | Normann et al. |
| 6,257,065 B1 | 7/2001 | Kyrtsos |
| 6,262,659 B1 | 7/2001 | Korkosz et al. |
| 6,799,112 B1 | 9/2004 | Carter et al. |
| 6,910,863 B2 | 6/2005 | Scardicchio et al. |
| 7,046,164 B2 | 5/2006 | Gao et al. |
| 7,241,053 B2 | 7/2007 | Sato et al. |
| 7,475,549 B2 | 1/2009 | Alexander et al. |

(Continued)

FOREIGN PATENT DOCUMENTS

| | | |
|---|---|---|
| EP | 2146358 A2 | 1/2010 |
| JP | 2011124367 A | 6/2011 |
| KR | 1020060017592 | 5/2007 |

OTHER PUBLICATIONS http://www.epanorama.net/documents/components/transformers.html, Transformers. ePanorama.net—Electronic components. copyright 1994-2009. Publisher:www/ePanorama.net, Published on the World Wide Web.

(Continued)

*Primary Examiner* — William H Rodriguez

(57) ABSTRACT

An inductance-stable ultra high temperature circuit coupling transformer (50) used to transmit and receive alternating current power and/or data signals (29", 33"). Primary (30") and secondary (34") windings are formed on nanostructured laminated (31') primary and secondary steel cores (32") having a Curie temperature exceeding an ultra high operating temperature. The operating range can extend from ambient to 250° C. or to in excess of 550° C. or up to 700° C. with a change in inductance of less than 10% in various embodiments.

16 Claims, 4 Drawing Sheets

(56) References Cited

U.S. PATENT DOCUMENTS

| | | | |
|---|---|---|---|
| 7,523,615 B2 | 4/2009 | Singh et al. | |
| 7,562,519 B1 | 7/2009 | Harris et al. | |
| 7,743,600 B2 | 6/2010 | Babu et al. | |
| 8,223,036 B2 * | 7/2012 | Mitchell et al. | 340/870.07 |
| 8,527,241 B2 * | 9/2013 | Mitchell et al. | 702/188 |
| 8,629,783 B2 * | 1/2014 | Mitchell et al. | 340/870.07 |
| 2006/0038988 A1 | 2/2006 | Thermos | |
| 2007/0025843 A1 | 2/2007 | Dejaune et al. | |
| 2009/0115627 A1 | 5/2009 | Duffy et al. | |
| 2009/0121896 A1 | 5/2009 | Mitchell et al. | |

OTHER PUBLICATIONS

Kerby Hull, Telemetry for Sensors, Presentation at the ISA NorCal Chapter Tech 2005 Conference, May 4-5, 2005, 1-59, Lebow Products, Inc., Troy, MI.

Mini-Circuits, RF Transformers, brochure, 918/99, Mini-Circuits, Brooklyn, NY.

DeAnna, Russell G. NASA/TM-2000-209815. Wireless Telemetry for Gas-Turbine Applications. ARL-MR-474, ARL-MR-474, NASA, U.S. Army Research Laboratory, Glenn Research Center, Cleveland, Ohio, Mar. 2000.

* cited by examiner

GAS TURBINE ENGINE COMPRISING AN ULTRA HIGH TEMPERATURE CIRCUIT COUPLING OPEN CORE TRANSFORMER

FIELD OF THE INVENTION

This invention relates to a circuit coupling (e.g. transformer) in an ultra high temperature environment such as in a gas turbine engine.

BACKGROUND OF THE INVENTION

The present invention is useful for monitoring operating environments, and in particular, to instrumented components and telemetry systems enabled for wirelessly transmitting electronic data indicative of individual component condition within an ultra high temperature operating environment such as that of a combustion turbine engine. One such system is described in pending U.S. patent application Ser. No. 11/936,936 filed on Nov. 8, 2007, published as United States Patent Application Publication 2009/0121896 A1 on May 14, 2009, attorney docket number 2007P20938US, incorporated by reference herein.

The usual range of operating temperatures for transformers is from ambient to 200° C. However, optimization of current industrial processes requires that equipment sensors operate reliably and receive and transmit electrical power and signals in temperature conditions from ambient to temperatures which exceed 200° C. Depending on the specification and configuration of the electrical power source and signal transmission pathways required, transformers may form part of the instrumentation circuitry and/or can be used to adjust and transmit frequency and voltage as require for a particular use.

When wires cannot be routed directly from the outside to sensors inside a containment vessel of an industrial process, such as a gas turbine engine, transmission of power and/or data is induced across a gap to maximize reliability and reproducibility. To effectively transmit power and/or data across a gap, a primary coil on one side and a secondary coil on the other side are used. The power and frequency sent through the primary coil induces a power and frequency in the secondary coil to complete the transmission of an electrical signal. At efficiencies less than 100%, the amount of power induced in the secondary coil is less than the power provided through the primary coil. Materials presently used as transformer cores have a magnetic permeability, which degrades as the temperature increases into high temperature ranges, thereby reducing the efficiency of the power transmission through the transformer. For this reason, manufacturers of transformer cores do not rate their transformer core materials as being effective above 250° C.

FIG. 1 shows a conventional prior art closed core transformer 28. Primary circuit current flow 29 of an alternating frequency through the primary coil 30 having multiple windings creates an alternating magnetic field in the core 32. The alternating magnetic field is carried by the core 32 to the secondary coil 34 having multiple windings to create a secondary circuit alternating frequency current flow 33.

Russell G. DeAnna in his report on Wireless Telemetry for Gas-Turbine Applications (NASA/TM-200-209815)(ARL-MR-474) from the Glenn Research Center March of 2000 stated:

(page 8) "A reasonable goal for these telemetry systems is operation at a temperature up to 500° F. (260° C.). This would allow an uncooled package located outside the gas path in the compressor region. The transmitting package would have to be cooled in the combustor and turbine sections. Designing a telemetry system for operation at 260° C. and beyond will be challenging.

Karnani (1998) demonstrated wireless telemetry using inductive coupling of power and data at 392° F. (200° C.), and makes recommendations on high-temperature components such as capacitors, resistors, oscillators, and solder . . . . The variation of resistivity with temperature is the most important effect on resistors . . . . High temperature electronics failures are often due to packaging technology rather than the actual material employed or the electrical failure of the component.

Current telemetry systems use 1970's analog technology, require cooling below 257° F. (125° C.), and have limitations in accuracy and channel capacity. A new system should be digital and allow improved data quality and quantity, while allowing operation at higher temperature—at least 392° F. (200° C.)—in the hot gearbox oil where these systems are frequently located. The system would require shaft mounting. Since the telemetry system is rotating, sensors are usually hardwired to the telemetry system.

(page 10) High-Q circuits are desired to maximize power transfer. In wide-temperature applications, however, high-Q circuits are not the only goal because LRC components have temperature-dependent properties and the circuit can drift out of resonance if the circuit Q is too high. Hence, the circuit gain should be spread out over a larger band of frequencies in order to accommodate any frequency variation. Q equal to 23 was used by Karnani (1998) in a circuit designed to operate over a temperature range of 392° F. (200° C.). The low Q was obtained by using a transmitter coil with only two turns of copper.

A critical issue for gas-turbine applications is the proximity of the coils to magnetic materials like steel . . . . The system must therefore be designed so that the power coils are located as far as possible from steel, or else sufficient excess power must be available at the primary coil so that the losses can be tolerated. A ferrite core may be used in the secondary coil to improve efficiency. When using ferrite, however, the frequency dependence of the permeability must be observed to avoid possible saturation at high frequencies."

FIG. 2 is a schematic illustration of an air core transformer 40, with a ferrite core 37 in the secondary coil as suggested by DeAnna to improve transmission efficiency. Primary circuit current flow of an alternating frequency 36 through the primary coil 35 having multiple windings creates an alternating magnetic field in and around the primary coil 35 which induces an alternating magnetic field in the ferrite core 37 and the secondary coil 38 having multiple windings surrounding the ferrite core to create a secondary circuit alternating frequency current flow 39.

There still exists a need to power ultra high temperature electronics reliably and repeatably while reducing or eliminating the variations in electrical circuit characteristics due to temperature changes for temperatures exceeding 200° C.

BRIEF DESCRIPTION OF THE DRAWINGS

The invention is explained in the following description in view of the drawings that show.

DETAILED DESCRIPTION OF THE INVENTION

Figure 1:
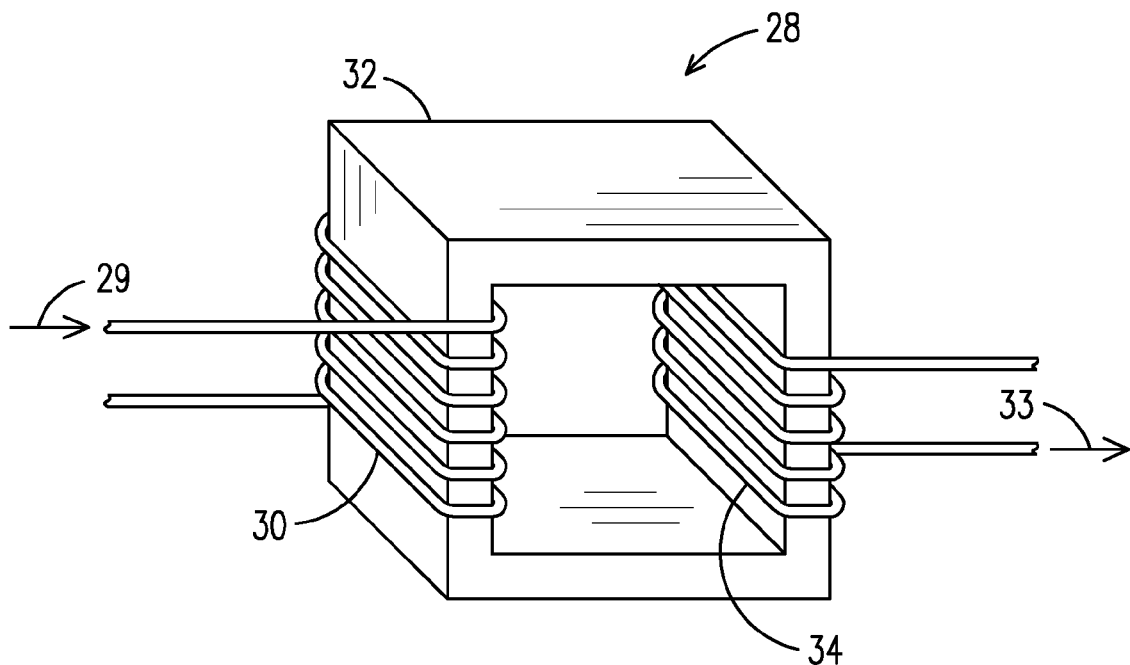
FIG. 1 is an illustration of a prior art closed core solid bulk material transformer.
Figure 2:
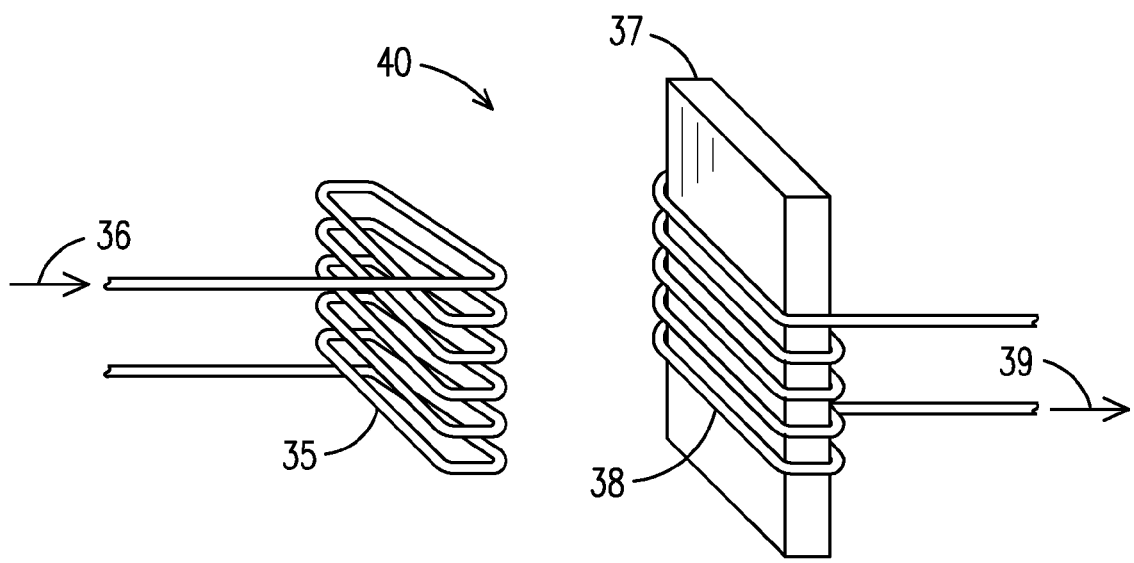
FIG. 2 is an illustration of a prior art air core transformer where a ferrite core is illustrated in the secondary coil to improve efficiency.

Smart components offer the possibility for real-time monitoring of component condition during operation of turbine engines, such as industrial gas turbines, aircraft engines, and turbines used in the oil and gas industry. Knowing the condition of components in a turbine has many benefits, including optimizing turbine operation based on internal engine parameters and condition-based maintenance. With such knowledge significant improvements in performance and reductions in operating costs of advanced turbine engines may be realized. The current practice of instrumenting turbine components involves mounting sensors to components, running lead wires to routers and bringing large bundles of lead wires long distances out of the turbine to a monitoring location. The process is slow, labor intensive, expensive, unreliable, and requires modification of many of the components of the turbine in order to allow for the inclusion of all the lead wires and to provide a means for transferring electronic signals to operate electronic circuitry on a rotating component. Wireless telemetry is particularly useful for extracting data from stationary and moving components by reducing, if not eliminating, the need for complex lead wire runs and mechanical connectors. Battery powered circuitry may be used at relatively low temperatures; however, in locations where the temperatures are too great for battery use (typically >125° C.), powering circuitry on stationary and moving components such as in gas turbine engines requires employing innovative techniques such as induced RF power. To use induced power in a region with an operating temperature >200° C., transformers are required to operate at such temperatures. Such requirements exceed the current state of the art of high temperature transformers which have a current temperature operating limit of about 200° C.

The present inventors are unaware of any transformer rated for operation at temperatures exceeding 200° C. Embodiments as disclosed herein provide a unique combination that form a system capable of providing wireless telemetry at temperatures >200° C. Temperatures of portions of turbine engines are typically in excess of 250° C. and temperature regions as high as 550° C. exist at locations where it may be desirable to place sensors. Embodiments discussed herein illustrate a transformer that operates effectively at temperatures up to and greater than 250° C., or 300° C., or 400° C., or 500° C. and on up to 700° C. or more.

Current transformer design for solid core and air gap core transformers provides, for example, the following guidance, which was found via the Internet at the following web address: http://new.epanorama.net/documents/components/transformers.html "Transformers without air gap When you know core area you can calculate the number of turns for transformer primary for transformer without air gap in core using the following formula:

$$N1 = sqrt((10^8 * L1 * l)/(u * Afe))$$

Where:
*N1=number of turns in primary coil
*Afe=core area (cm^2)
*L1=primary coil inductance (H)
*l=average length of magnet flow force lines (cm) (length of line around coil going through inside the core)
*u=relative permeability of magnetic material (around 500 for typical transformer iron)

You can determine the number of turns on secondary coil using the following formula (expects transformer efficiency of 90%):

$$N2 = 1.1 * U2/U1 = 1.1 * sqrt(Z2/Z1) =$$

Where:
*N1=number of turns in primary coil
*N2=number of turns in secondary coil
*U1=primary voltage
*U2=secondary voltage
*Z1=primary impedance
*Z2=secondary impedance Transformers with air gap If there is any DC current flowing on transformer primary, the primary inductance is reduced. To compensate the effect of this (in circuits where this is a problem) the core should have a small air gap in the core. In practice the air gap should be selected to be around ¹⁄₁₀₀₀ of the length of the magnetic lines in the core. In this case the following equation can be used to determine the number of turns needed for primary coil:

$$N1 = sqrt((L1 * li)/(Afe * 10^8))$$

Where:
*N1=number of turns in primary coil
*Afe=core area (cm^2)
*L1=primary coil inductance (H)
*li=size of the air gap (mm)

Note that this formula gives much larger number of turns for primary coil than the equation for transformer without air gap."

Comparing the relationship of inductance (L) for a closed core transformer and an air gap core transformer in the equations for the primary winding we find:

$$L1 = (N1^2 * (u * Afe))/(10^8 * l) \text{ [closed core]}$$

$$L1 = (N1^2 / (Afe * 10^8))/(li) \text{ [air gap core]}.$$

This shows that the inductance in a closed core transformer is proportional to the "relative permeability of magnetic material (μ)" and that in an air gap core transformer the inductance is inversely proportional to the "size of the air gap (mm) (li)." These relationships establish the conventional expectations that when all other variables are held constant, the inductance will be constant with respect to the inductance of transformers in the selected (closed or air gap core) configurations.

Figure 3:
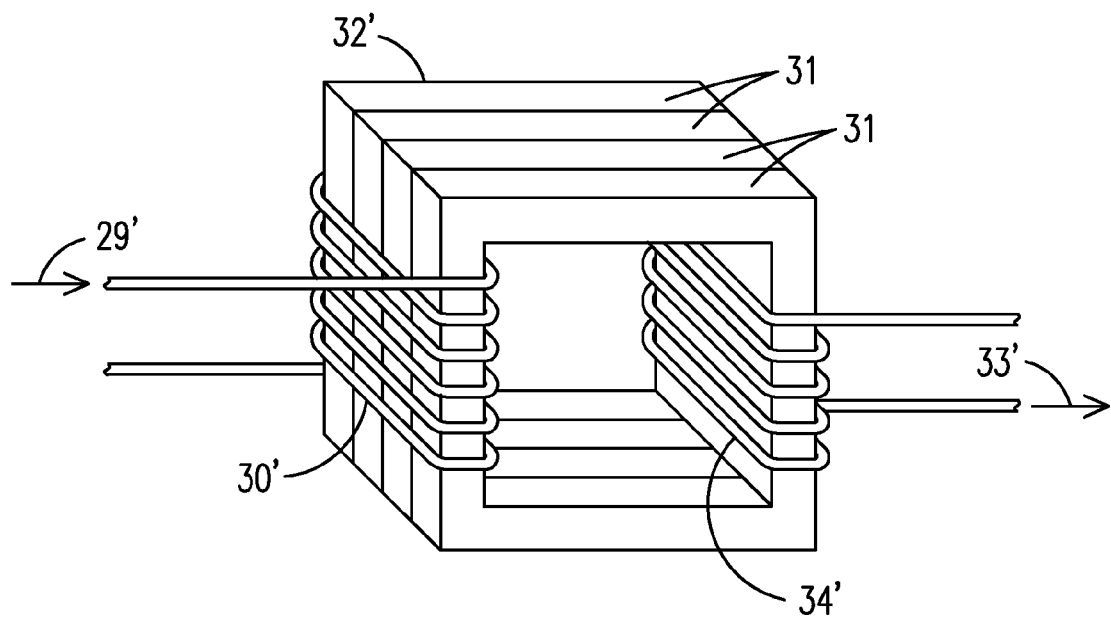
FIG. 3 is a laminated closed core transformer.
Figure 4:
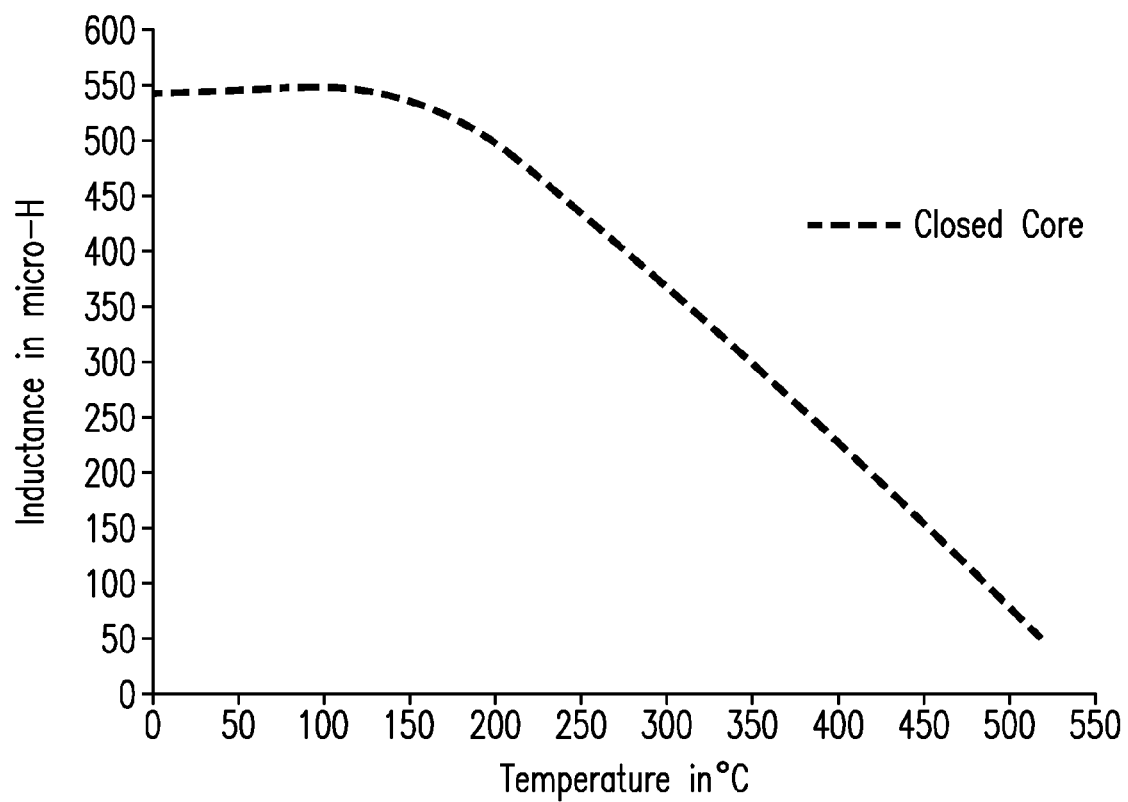
FIG. 4 is a graphical plot relating inductance in microhenrys (μH) with respect to temperature for the closed core transformer illustrated in FIG. 3.

Testing of circuit and innovative transformer configurations was undertaken to model prototype configurations for use in ultra high temperature environments. The inductance of a configuration of a closed core transformer (as shown in FIG. 3) versus temperature for a particular frequency is shown in FIG. 4. The component nomenclature with items 29', 30', 32', 33' and 34' corresponds to similarly numbered items in FIG. 1, i.e., 29, 30, 32, 33, and 34, however the core 32' of the transformer in FIG. 3 is constructed using high Curie temperature nanostructured steel laminations 31.

As shown in FIG. 4, the inductance of the closed core transformer begins degrading at about 150° C. and drops rapidly along a linear plot as the temperature reaches 525° C. Use of transformers with deteriorating inductance with increasing temperature is not acceptable for sensor circuitry. For sensors to work properly in the full range from ambient to ultra high temperatures, it is necessary that they receive a constant voltage which does not vary with temperature, since sensors such as thermocouples operate by reacting to a change in temperature by varying their output voltage. A variation in the sensing circuit voltage obliterates the changes in voltage resulting from a change in temperature of the thermocouple and thereby makes such a system unsuitable. Since the inductance of closed core transformers degrades severely with increasing temperature, the goal of a constant power supply voltage is also difficult if not impossible to achieve. Circuit elements such as Zener diodes, which might commonly be used at lower temperatures to stabilize circuit output are not functional at high temperatures. There are no Zener diodes capable of operating at temperatures from 300 to 500° C.

The present inventors nave innovatively discovered circuit and transformer configurations (circuit couplings) using specific materials that can withstand ultra high temperatures (a range from 200° C. to 550° C. and higher), and they have found an unexpected solution to the problem of ultra high temperature degradation of transformer inductance. As such, the present invention has provided a surprising and a previously unknown solution for using telemetry transformers in ultra high temperature environments. A stable low level inductance (having a variation in inductance of less than 10% of its inductance value at ambient temperature) can be achieved from ambient to ultra high operating temperatures when using an air gap core transformer with a high Curie temperature core material and ultra high temperature capable wiring. A rule of thumb is that metals are structurally stable at temperatures up to about one half of their melting temperature. For example, copper melts at 1,083° C. and is useful to about 500-550° C. For higher temperatures, a higher melting point material such as platinum would be used. The Curie temperature of the material must be above the operating temperature.

Figure 5:
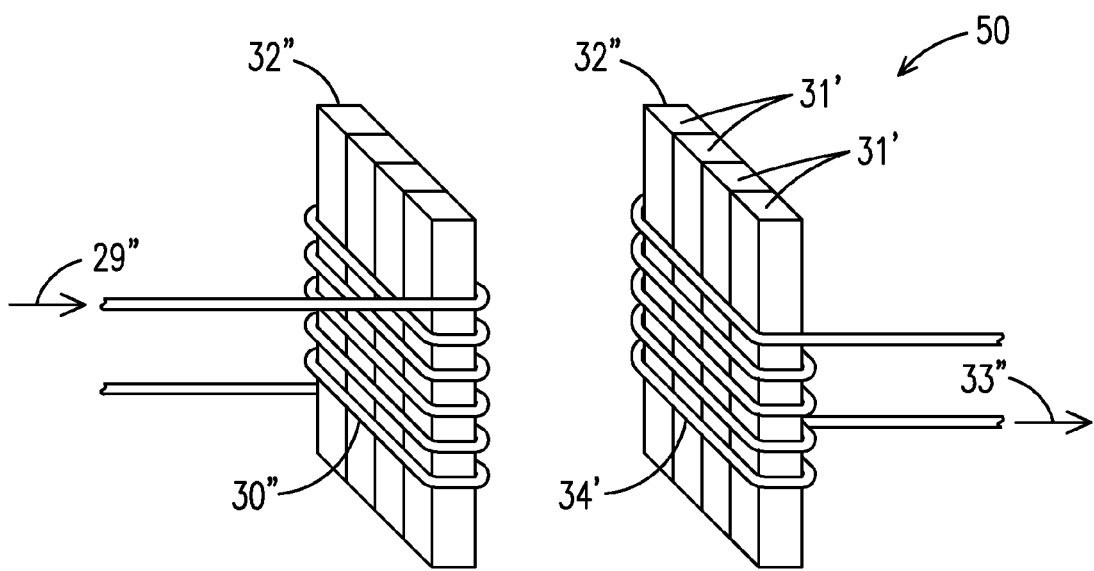
FIG. 5 is a laminated nanostructured steel air gap core transformer.
Figure 6:
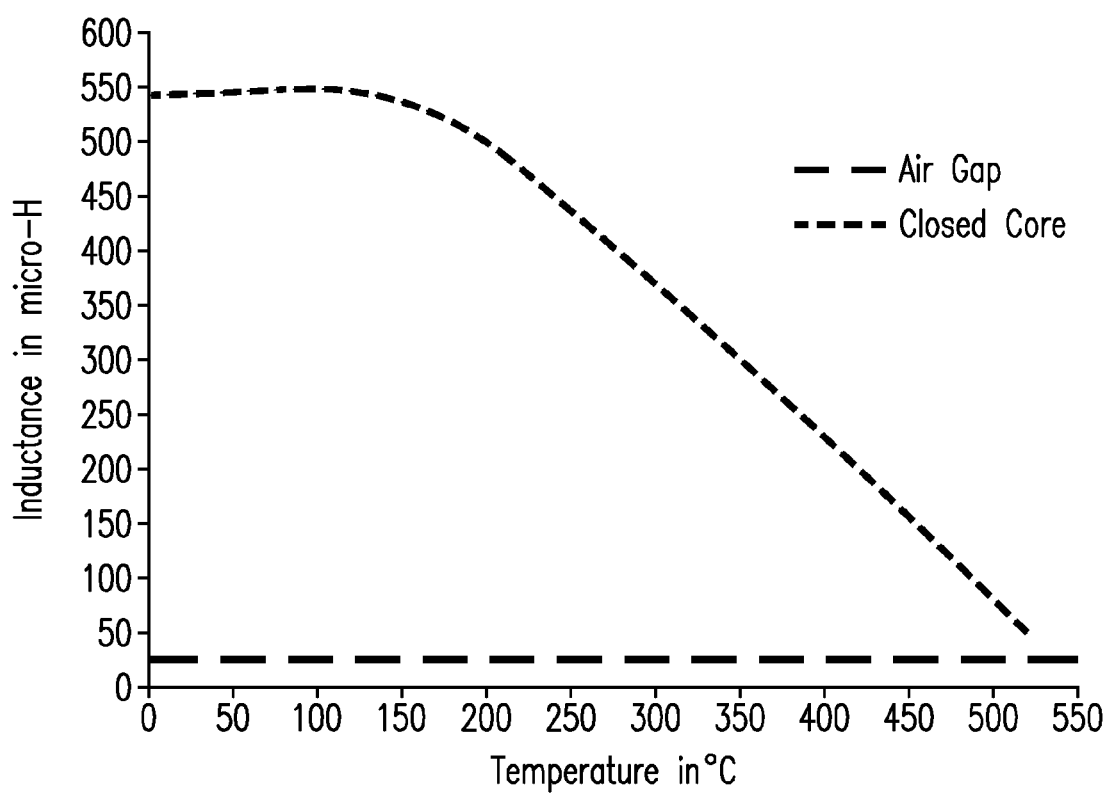
FIG. 6 is a comparison graphical plot showing the relationship of inductance to temperature when comparing the closed core transformer of FIG. 3 with the air gap laminated nanostructured steel core transformer of FIG. 5.

In one embodiment, a laminated air core gap transformer 50, with nanostructured steel cores in both the primary and secondary windings, is shown in FIG. 5. For the transformer 50 the component nomenclature with items 29", 30", 32", 33" and 34" corresponds to similarly numbered items in FIG. 3, i.e., 29', 30', 32', 33' and 34'. As illustrated for the transformer 50 in FIG. 5, the portion of the core 32" in the primary coil 30 (i.e., the primary core or primary core material) is not connected to the portion of the core 32" in the secondary coil 34 (i.e., the secondary core or secondary core material). Thus the core 32" is not connected between the primary and secondary windings. The transformer 50 was tested to correlate Inductance to Temperature. The plot of the results in comparison to the plot of FIG. 4 is shown in FIG. 6. While the efficiency, i.e., total inductance at low temperatures (<150° C.) is low, the inductance does not vary appreciably (well less than 10% variation) with an increase in temperature from ambient to above 525° C. Thus, in circuits that can tolerate low efficiency, the benefit of a constant inductance (and thereby constant voltage) across the gap in an air gap core transformer provides a previously unknown solution to a constant voltage supply for ultra high temperature circuits.

Inductance should be stable or constant to enable using a transformer at ultra high temperatures (>250° C.). To achieve a stable inductance at ultra high temperature, any core material with a high Curie temperature and sufficient permeability should be used, such as ceramic ferrites, nanostructured steels, nanocrystalline iron alloys and some silicon-steels. Both standard and nanostructured microstructures are expected to be usable in various embodiments.

Standard silicon steels work at temperatures up to about 350° C., but at higher temperatures they start resistance heating and driving their own temperature up.

Other core materials that may be usable should have high Curie temperatures, such as ferrites or laminate steel materials. The laminate steel materials are typically Fe-rich alloys containing elements such as Si, Co, B, C, La, Ni, and may have standard or nanocrystalline microstructures.

One composition of nanocrystalline iron alloys is sold under the trade name NAMGLASS® and has a composition of approximately 82% iron, with the balance being silicon, niobium, boron, copper, carbon, nickel and molybdenum. It has been determined that such nanocrystalline iron alloy material exhibits desirable characteristics such as a Curie temperature greater than 500° C., very low coercivity, low eddy-current loss, high saturation flux density and the permeability is very stable from ambient temperature over the entire ultra high temperature operating range. This nanocrystalline iron alloy material is commercially available in tape-wound configurations in the form of toroids, or "C" core transformer cores. Embodiments described herein utilize this nanocrystalline iron alloy (or another) material in an "I" core shape configuration, as discussed further below.

Another commercially available product that may be used is Vitroperm 800, a nanostructured laminated silicon steel core available from Vacuumschmelze in Germany (World Headquarters: VACUUMSCHMELZE GmbH & Co. KG-Grüner Weg 37-D-63450 Hanau).

A nanostructured coating (in comparison to being a bulk material) on a steel or other substrate may have a similar benefit when used as a transformer core, if resistance heating can be avoided.

The inventors have realized that the insulating layer between the very thin layers of the laminates may be a thin layer of epoxy. Even if the epoxy becomes oxidized upon heating, it has been found that the insulating functionality is not lost, since the current between laminates is very small and any remnant of oxidized epoxy is sufficient to maintain adequate electrical separation, perhaps in part due to the geometry of the core stacks which are not well connected for electrical conduction. Aging tests of 100 hours have shown no deterioration of functionality.

The nanostructured steels maintain their magnetic properties from room temperature to about 570° C., although above that temperature they start losing their functionality. Silicon steel maintains its magnetic properties from room temperature to about 700° C.

The wire for winding such transformers needs to have sufficient conductivity and oxidation resistance at the target ultra nigh temperature. Potential wire materials may be made from noble, conductive metals, such as Ni, NiCr, 90/10 nickel/chromium (Chromel®), Pt, etc, or from standard conductors with oxidation resistant coatings, such as Ni-clad Cu, and conductive wire with ceramic coatings. For correct transformer functionality, the windings must be electrically insulated from one another and surrounding or adjacent conductors. In conventional transformers, this is typically accomplished using polymer epoxy materials. However, the ultra high use temperature of transformers contemplated herein precludes the use of such insulating materials.

In addition to the thin ceramic coating on the wires, which is present for oxidation protection, ceramic cement materials may be used as potting material to ensure electrical insulation between the windings.

The wire used for winding the cores may be made of a 27% nickel-clad copper with ceramic insulation in order to reduce oxidation and failure at ultra high temperatures. The wire can be ceramic coated nickel clad copper. Pure nickel wire has been tried, but the resistance of the nickel wire is high, so it only provides optimal performance in a limited number of configurations, including where few windings on cores and short runs of wire are used. Handling characteristics of ceramic coated wire are significantly more challenging than standard organic-insulated copper as a result of the protective ceramic coating, and care must be taken to ensure the integrity of the insulating material when winding the coils. Other wire material may be insulated silver, anodized aluminum, or platinum. A ceramic coated nickel clad copper is used in one embodiment, and platinum wire has been used when the temperature is too high for copper.

Ceramic coated wire is available from Ceramawire (786 Pitts Chapel Rd., Elizabeth City, N.C. 27909) and California Fine Wire (338 So. Fourth Street, Grover Beach, Calif. 93433-0199). The ceramic coatings may be applied as a slurry coat or sputtered on, with the sputtered coating typically being more adherent and thicker.

Many types of ceramic potting materials may be used in the insulation of both the primary and rotating induction coil assemblies 186, 195 (two are described below). It is important to ensure the windings 192, 201 do not short (conduct) to the core elements 190, 200. In addition to ceramic insulation supplied on the wires, a compound, such as H cement, a ceramic cement with ultra fine particle size, may be used as an insulating base coat on the winding cores 190, 200. Once the winding cores 190, 200 are wound they may be potted with Cotronics 940, an aluminum oxide based ceramic cement. A goal for the oxidation protection is to reduce the oxidation rate by a desired percentage to achieve a desired operating life in an expected operating environment.

Figure 7:
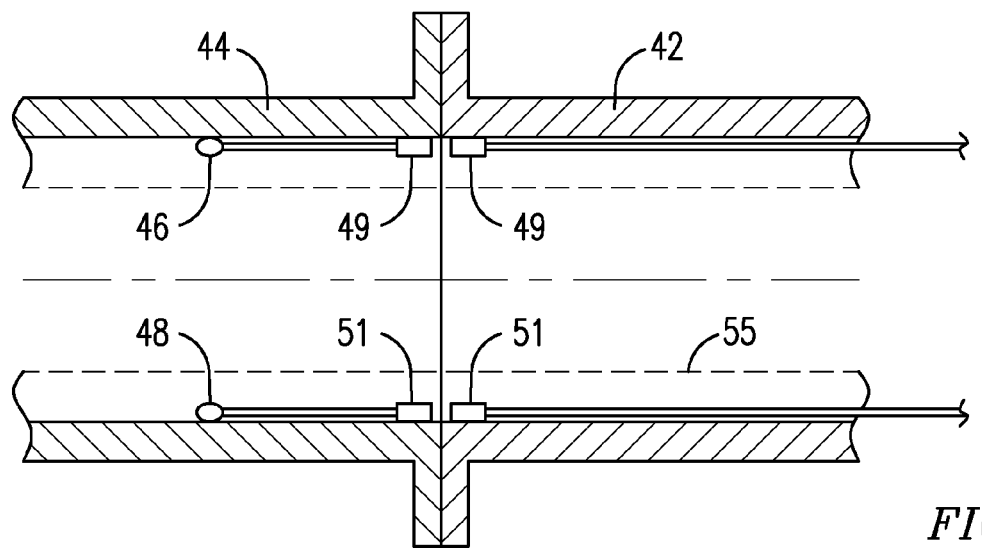
FIG. 7 is a schematic cross sectional view of a stationary portion of a casing containing sensors whose circuitry spans a gap of a joint of the casing.

Air gap core transformers can be used in stationary configurations as shown in FIG. 7. To avoid having to make disconnections across the boundaries of sections 42, 44 of machines from sensors 46, 48 in enclosures experiencing temperatures greater than 200° C., it is preferable to have non-contact connectors between adjacent machine or casing sections 42, 44. An air gap core transformer 49, 51 provides an electrical connection across the joint without the need for a mechanical connector. The dashed line 55 represents the boundaries of an internal casing or purge cavity which is flooded with purge or other gas) to keep the components at least partially protected from the harsh environment inside the ultra high temperature processing chamber (or turbine). While the casings 42, 44 are here shown at the outside periphery of the casing structure, the purge space may alternately be centrally located as a lining or shield (such as at the root of turbine blades) on a rotating shaft. In both instances the principle is that peak temperatures in the enclosure are limited by a flow of purge gas. The normal operating temperature of the gas turbine is about 1300° C., and the sensors may operate in the hottest regions of the engine. Telemetry system, including the components shown here, would be mounted in a purge cavity where the temperature is unlikely to exceed 550° C.

The sensory or power wires can be routed to a first module primary coil on a first side of the casing split while wiring to a sensor is routed to the second side of the casing split. Thus when the casing is disassembled a service worker does not have to disengage wiring as the close proximity of the coils on both sides of the split automatically transfers signals and/or power during operation without the need for a connector or splice across the casing joint. The elimination of the need to pot or otherwise connect or disconnect mechanical connectors during maintenance operations provides an advantage and time savings in maintaining sensors and sensor circuitry in ultra high temperature operating environments.

The casings for turbine engines are split shells. Currently static circuitry and sensors are hardwired across casing splits. When the casing is split (such as during maintenance) each wiring connection is broken (cut) and is re-connected (e.g., re-spliced) when the casing is re-closed. Such re-connection activities are time consuming and reduce instrumentation reliability. The current system can connect a circuit wirelessly cross a casing gap. In such a configuration, the casing can be opened and closed without disturbing the hardwired circuitry and sensors. The system can be run without delay due to wiring reconnection. The step of re-splicing wires, which may be unreliable, is eliminated. The use of a stationary wireless circuit connection could be used anywhere where circuit (sensor) elements are stationary during operation, but are separated for maintenance.

An example of a circuit where this wireless connection would be used is in a rotating transceiver circuit that is "semi-passive." In this context a semi-passive circuit can be contrasted to circuits that are fully active (which generate their own power). Here a semi-passive circuit takes induced power from the external source, stores the energy for a short time (i.e., by using a capacitor) and processes that energy through a sensor and then transmits its data reading back across the gap. Such a semi passive circuit and sensor are contrasted with a passive sensor which receives an initiating signal (like an RFID element) and immediately initiates a responsive signal. The semi passive sensor activated circuit is not an RFID circuit.

Figure 8:
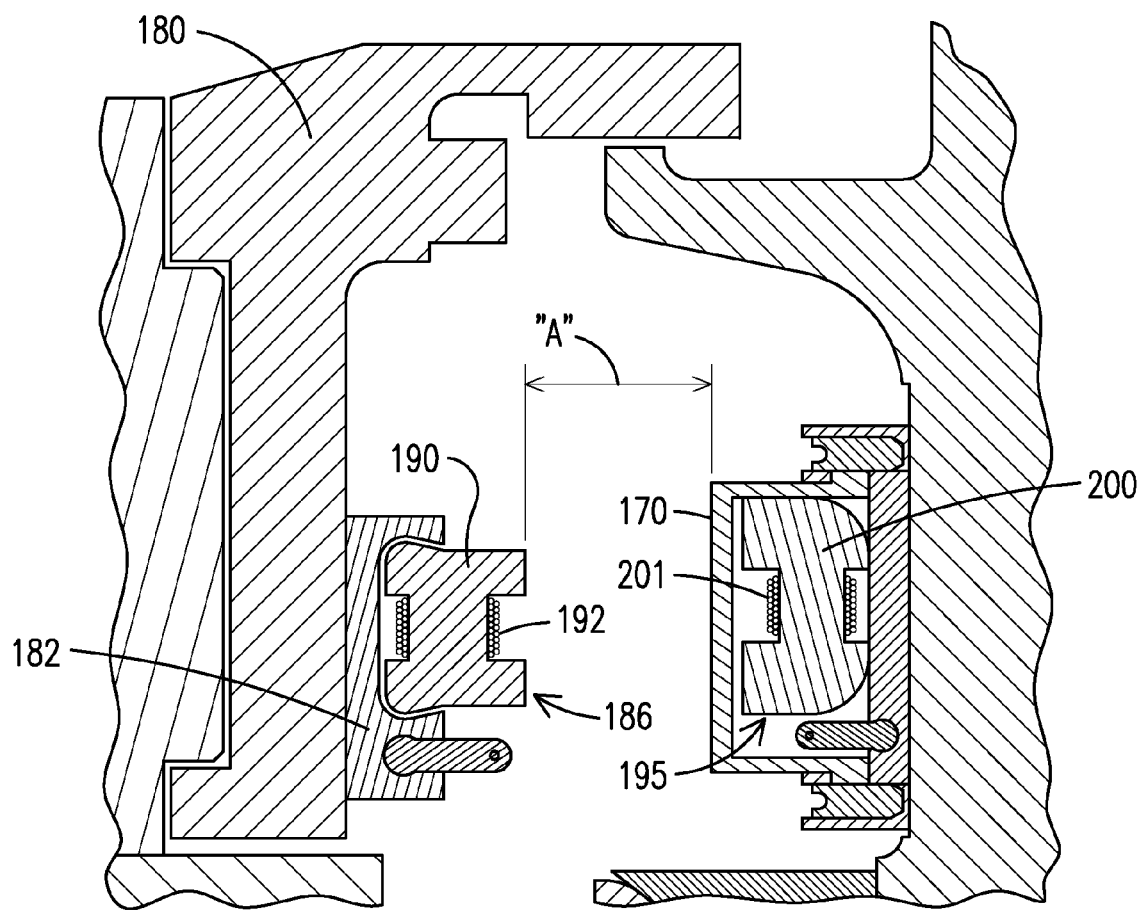
FIG. 8 is a partial cross sectional view of a turbine static seal and a turbine blade assembly showing both stationary and rotating elements of a transformer operating as part of sensor circuitry for sensing operating parameters on the rotating elements in an ultra high temperature environment.

FIG. 8 shows a portion of a turbine static seal arrangement which may be mounted proximate a turbine engine blades root where a secondary induction coil assembly 195 is in circuit coupling communication with a stationary induction coil assembly 186. Single or multiple stationary primary induction coils 186 may be arranged on the interior surface of one or more static seal segments 180 to form an arc that is circumscribed by rotating secondary induction coil assembly 195 when the combustion turbine is in operation.

In one embodiment, the induction core 190, 200 of each induction coil assembly 186, 195 is formed of a plurality of 0.007" thick laminae of nanocrystalline iron alloy material interspersed with insulating layers (e.g., epoxy) built up into an arc of approximately eleven inches in length. One example of a core lamination section assembly formed of multiple laminates has dimensions of about ⅜" (inches) thick by ⅜" wide by ½" tall.

An arcuate bracket 182 has channels or grooves formed therein within which the stationary primary induction coil assembly 186 may be secured. A non-conducting holder (riot shown) may be used to ensure that primary induction coil assembly 186 does not contact bracket 182, which may be fabricated of metal. The non-conducting holder may be fabricated from zirconia, alumina, zirconia-toughed alumina (ZTA—a toughened ceramic material), or other structural ceramic material, as can also be used for an RF transparent cover 170.

Primary induction coil assembly 186 may be formed with lobes in the region of attachment to the bracket 182. The associated regions of material in the bracket 182 are removed in the same lobe shape, with a slightly larger sized to accommodate installation. The lobe shape defines a radius of curvature that enables positive retention of the induction coil assembly 186, which may be placed into the bracket 182 from an end and slid into position. The lobe shape enables positive retention to be maintained while simultaneously ensuring that tensile stresses are not generated in induction coil assembly 186 which may be fabricated of relatively brittle materials subject to structural failure under tensile stresses. Ceramic cement may be applied between the surfaces of the induction coil assembly 186, in order to provide a secure fit and accommodate thermal expansion differences during heat up and cool down. A thin plate (not shown) may be attached on each end of the bracket 182 that covers the lobed regions of the induction coil assembly 186, ensuring retention during operation. One or more brackets may be fabricated of the same alloy as static seal segment 180, such as Inconel 625, and have an arcuate shaped to conform to the interior surface of static seal segment 180.

The bracket 182 may be affixed to the interior surface of static seal segment 180 using an interrupted weld to minimize distortion of static seal segment 180. Induction coil assembly 186 may include at least one stationary core 190 and at least one stationary primary winding 192 secured with "H cement" sold by JP Technologies. The cores 190, 200 may have multiple side by side laminated core elements (building blocks), each one being constructed of its own 0.007" thick laminations, with each block having dimensions of ⅜" (thick)×⅜" (wide)×½" (tall).

One or more stationary primary windings 192 may be energized by high frequency, high current power sources. The power can be supplied to each stationary induction coil assembly 186 individually, or a series of stationary induction coil assemblies 186 may be electrically connected and driven by single power supply. In an exemplary embodiment there may be five adjacent, stationary induction coil assemblies 186 with each driven by its own power supply. Current flowing through each stationary primary winding 192 increases a magnetic field in the rotating secondary induction coil assembly 195 that in turn creates a current in the rotating secondary winding 201. Current from the rotating secondary winding 201 supplies power to a wireless telemetry transmitter circuit contained within wireless telemetry transmitter assembly.

FIG. 8 illustrates that an initial gap "A" may exist between RF transparent cover 170 and stationary core 190 prior to startup of combustion turbine 10. Initial gap "A" may be about 13 mm at startup of combustion turbine and reduce to about 4 mm at baseload when turbine blade and static seal segment 180 are closer together. The gap "A" can be anywhere from 2 mm to 30-50 mm, depending on how much space is available. In one configuration the primary coil is three times the size of the secondary coil. The efficiency diminishes as they get farther apart, so the larger the primary core and coil are, the farther away the primary coil can be from the secondary coil before the signal is lost due to decreased efficiency of energy transfer.

Multiple individual primary and secondary induction coil assemblies 186, 195 may be used to accommodate various geometries within a combustion turbine. For instance, stationary induction coil assembly 186 may need to span a certain distance of static seal segment 180 in order to induce enough power in the system components to operate the circuitry and transmit the required data. The induction coil assembly 186 may need to be approximately four feet in length. In this example, for ease of fabrication, four individual power/antenna assemblies each with a length of approximately one foot may be fabricated with respective brackets 182 and installed adjacent to one another on one or more static seal segments 180. If the end-to-end gap distance between the individual coil assemblies is sufficiently small, then the multiple coil assemblies will function as a single four-foot long coil assembly. Such coil assemblies may be formed from straight or curved elements thereby providing assemblies of varying lengths that are straight, curved or otherwise configured as required by the specific application. A plurality of such coil assemblies may span an arc of approximately 112 degrees in the top half of one or more static seal segments 180 within the turbine.

While various embodiments of the present invention have been shown and described herein, it will be obvious that such embodiments are provided by way of example only. Numerous variations,.changes and substitutions may be made without departing from the invention herein. Accordingly, it is intended that the invention be limited only by the spirit and scope of the appended claims.

The invention claimed is:

1. A circuit coupling in a high temperature device with stable inductance throughout an operating temperature range between an ambient temperature and a maximum operating temperature ranging up to at least 500 degrees Celsius, the circuit coupling comprising:
   an air gap core transformer positioned for operation as a telemetry transformer in an operating environment characterized by the maximum operating temperature, and having a primary induction coil assembly and a secondary induction coil assembly in proximity to one another with an air gap distance there between, the transformer characterized by a total inductance less than 100 micro-H during operation at temperatures less than 150° C. and throughout the operating temperature range, wherein the total inductance varies less than ten percent over a range extending from less than 150° C. to at least 500° C.,
   the primary induction coil assembly comprising a solid primary core material, characterized by a Curie temperature which exceeds that of nanostructured steel, and a primary coil wound about the primary core material, which coil maintains electrical conductivity of itself and maintains electrical isolation from nearby conductors at temperatures in excess of the maximum operating temperature range, the primary coil comprising a metal having a melting point temperature which exceeds that of copper, and
   the secondary induction coil assembly comprising a solid secondary core material characterized by a Curie temperature which exceeds that of nanostructured steel, and a secondary coil wound about the secondary core material, which coil maintains electrical conductivity and maintains electrical isolation from nearby conductors at temperatures in excess of the maximum operating temperature range, the secondary coil comprising a metal having a melting point temperature which exceeds that of copper, wherein the primary core material is not connected to the secondary core material.

2. The circuit coupling as in claim 1, wherein the maximum operating temperature ranges up to at least 700 degrees Celsius and wherein the total inductance varies less than ten percent over a range extending from less than 150° C. to at least 700 degrees Celsius.

3. The circuit coupling as in claim 1, wherein a first of the induction coil assemblies is affixed to a stationary component of the device and a second of the induction coil assemblies is affixed to a rotating component of the device which establishes the air gap distance there between periodically upon rotation of the rotating component.

4. The circuit coupling as in claim 3, wherein said rotating component comprises a blade in a gas turbine engine.

5. The circuit coupling as in claim 1, wherein the air gap core transformer is characterized by a total inductance less than 50 micro-H during operation at a temperature less than 150° C.

6. The circuit coupling as in claim 1, wherein the total inductance varies less than ten percent over a range extending from less than 150° C. to at least 550° C.

7. The circuit coupling as in claim 1, wherein at least one of the induction coil assemblies comprises a nanostructured iron alloy solid core comprising at least one of the elements Si, Co, B, C, La and Ni.

8. The circuit coupling as in claim 1, wherein at least one of the induction coil assemblies comprises a solid silicon steel core.

9. The circuit coupling as in claim 1 wherein at least one of the primary and secondary coils comprises a noble conductive wire.

10. The circuit coupling as in claim 1 wherein at least one of the primary and secondary coils comprises Ni-clad copper, Ni, NiCr, or Pt wire.

11. The circuit coupling as in claim 1 wherein at least one of the primary and secondary coils comprises conductive wire with a ceramic coating.

12. The circuit coupling as in claim 1 wherein at least one of the primary and secondary coils comprises a ceramic potting material.

13. In a gas turbine engine having first and second casing sections removably joined together along a joint during operation of the engine, a circuit coupling comprising:

a transformer having a primary side comprising a primary core and a secondary side comprising secondary core, the transformer providing stable inductance throughout an operating temperature range between a temperature less than 150° C. and a maximum operating temperature ranging up to at least 250° C., the transformer characterized by a total inductance less than 100 micro-H during operation at the temperature less than 150° C. wherein the total inductance varies less than ten percent over a range extending from less than 150° C. to at least 500° C., the primary side of the transformer attached to the first casing section proximate the joint and susceptible to exposure to a range of temperatures from less than 150° C. to an operating temperature greater than 250° C. within the engine and the secondary side of the transformer attached to the second casing section proximate the joint and proximate the primary side of the transformer and susceptible to exposure to a maximum operating temperature greater than 250° C., wherein:

the primary core and the secondary core of the transformer each comprise a material having a Curie temperature exceeding that of nanostructured steel, and the primary core is not connected to the secondary core.

14. The gas turbine engine of claim 13 wherein the transformer is characterized by a total inductance less than 50 micro-H during operation at a temperature less than 150° C.

15. The gas turbine engine of claim 13 wherein the transformer is characterized by a total inductance which remains stable within 10% of the total inductance in an operating temperature range extending up to at least 550° C.

16. The gas turbine engine of claim 13 wherein the material of the primary and secondary cores of the transformer having a Curie temperature exceeding that of nanostructured steel comprises silicon steel.

* * * * *